(12) United States Patent
Kim et al.

(10) Patent No.: US 8,039,900 B2
(45) Date of Patent: Oct. 18, 2011

(54) STACKED SEMICONDUCTOR DEVICES AND METHODS OF MANUFACTURING THE SAME

(75) Inventors: Kyoung-Seok Kim, Seoul (KR); Kong-Soo Lee, Hwaseong-si (KR); Sang-Jin Park, Seongnam-si (KR); Sung-Kwan Kang, Seoul (KR); Ko-Eun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 240 days.

(21) Appl. No.: 11/823,765

(22) Filed: Jun. 28, 2007

(65) Prior Publication Data

US 2008/0023770 A1    Jan. 31, 2008

(30) Foreign Application Priority Data

Jul. 26, 2006  (KR) .................. 10-2006-0070221

(51) Int. Cl.
*H01L 29/66*   (2006.01)

(52) U.S. Cl. . 257/365; 257/278; 257/774; 257/E23.145; 438/675; 438/155

(58) Field of Classification Search .................. 438/213, 438/222, 151, 155, 597, 672, 675; 257/67, 257/348, 353, 365, 635, 744, 745, 749, 773, 257/774, E21.085, E21.166, E21.586, E21.614, 257/E23.011, E23.168, E25.013, E25.018, 257/E27.026
See application file for complete search history.

(56) References Cited

U.S. PATENT DOCUMENTS

| | | | | |
|---|---|---|---|---|
| 5,374,572 A | * | 12/1994 | Roth et al. | 438/156 |
| 6,429,484 B1 | * | 8/2002 | Yu | 257/347 |
| 6,670,682 B1 | | 12/2003 | Mouli | |
| 2005/0151276 A1 | | 7/2005 | Jang et al. | |
| 2005/0179061 A1 | * | 8/2005 | Jang et al. | 257/208 |
| 2005/0248035 A1 | | 11/2005 | Son et al. | |
| 2005/0277235 A1 | * | 12/2005 | Son et al. | 438/166 |
| 2006/0292880 A1 | * | 12/2006 | Son et al. | 438/705 |
| 2007/0007532 A1 | * | 1/2007 | Kang et al. | 257/67 |
| 2007/0048913 A1 | * | 3/2007 | Son et al. | 438/151 |

FOREIGN PATENT DOCUMENTS

KR    1020040025967    *    3/2004
(Continued)

OTHER PUBLICATIONS

Wolf, "Silicon Processing for the VLSI Era, vol. 2." 1990, Lattice Press, pp. 62.*

*Primary Examiner* — Alexander Ghyka
*Assistant Examiner* — Leonard Chang
(74) *Attorney, Agent, or Firm* — Onello & Mello LLP (57) ABSTRACT

The stacked semiconductor device includes a semiconductor substrate, a multi-layered insulation layer pattern having at least two insulation layer patterns and an opening, an active layer pattern formed on each of the insulation layer patterns, a first plug including single crystalline silicon-germanium, a second plug including single crystalline silicon, and a wiring electrically connected to the first plug and sufficiently filling up the opening. The insulation layer patterns are vertically stacked on the semiconductor substrate and the opening exposes an upper face of the semiconductor substrate. A side portion of the active layer pattern is exposed by the opening. The first plug is formed on the upper face of the semiconductor substrate to partially fill the opening. The second plug is partially formed on the first plug, and has substantially the same interface as that of the first plug.

5 Claims, 6 Drawing Sheets

FOREIGN PATENT DOCUMENTS

| | | | |
|---|---|---|---|
| KR | 1020040059805 | * | 7/2004 |
| KR | 10-2005-0073948 | | 7/2005 |
| KR | 10-2005-0073956 | | 7/2005 |
| KR | 10-0519801 | | 9/2005 |
| KR | 10-0655664 | | 12/2006 |
| KR | 100655664 | * | 12/2006 |

* cited by examiner

STACKED SEMICONDUCTOR DEVICES AND METHODS OF MANUFACTURING THE SAME

CROSS-REFERENCE TO RELATED APPLICATIONS

This application claims priority under 35 USC §119 to Korean Patent Application No. 10-2006-0070221 filed in the Korean Intellectual Property Office on Jul. 26, 2006, the contents of which are herein incorporated by reference in their entirety for all purposes.

BACKGROUND OF THE INVENTION

1. Field of the Invention

Example embodiments of the present invention relate to a stacked semiconductor device and a method of manufacturing the stacked semiconductor device. More particularly, example embodiments of the present invention relate to a stacked semiconductor device, in which semiconductor structures such as transistors including a gate pattern and a source/drain region are vertically stacked, and a method of manufacturing the stacked semiconductor device having the vertically stacked semiconductor structures.

2. Description of the Related Art

As design rules of semiconductor devices have been recently decreased, sizes of semiconductor structures formed on substrates and distances between the semiconductor structures have been decreased. However, when the sizes and the distances of the semiconductor structures are continuously decreased on the same plane, resistances of the semiconductor structures may be increased, and thus electrical reliabilities of the semiconductor devices including the semiconductor structures may be degraded.

In order to solve the above problem, stacked semiconductor devices in which semiconductor structures are vertically stacked have been developed. Examples of the stacked semiconductor structures are disclosed in U.S. Pat. No. 6,538,330. The stacked semiconductor devices are mainly employed in a static random access memory (SRAM) device, a system-on-chip (SOC), etc.

The semiconductor structures in the stacked semiconductor device are formed in a plurality of insulation layers that are vertically stacked, and active layers that serve as channel regions are formed on the insulation layers. The active layers are mainly formed by a selective epitaxial growth (SEG) process using a semiconductor substrate, which may be partially exposed by a first opening formed through the insulation layer, as a seed layer. A plug is also formed in the first opening to fill up the first opening when the active layers are formed.

The vertically stacked insulation layers are patterned to form a second opening partially exposing the semiconductor substrate, and a conductive material is formed in the second opening so that the semiconductor structures in the stacked semiconductor device are electrically connected to one another. The second opening partially exposes not only an upper face of the semiconductor substrate but also side portions of the active layers, which are formed on the insulation layers.

Figure 1:
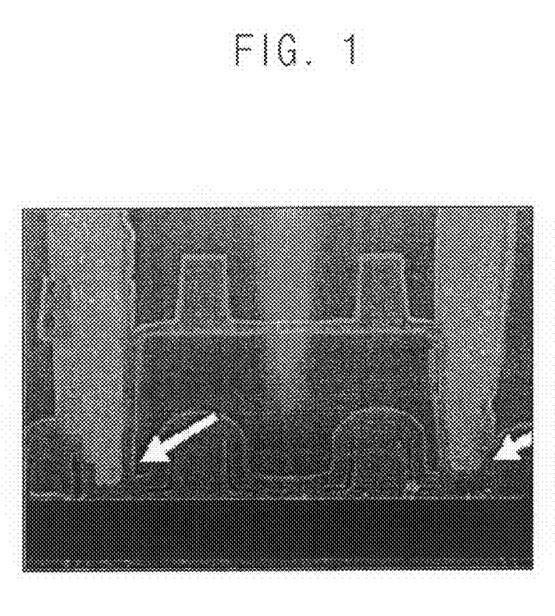
FIGS. 1 and 2 are images illustrating cross-sections of a conventional stacked semiconductor device.

However, as shown in FIG. 1, when the second opening is formed to expose the plug disposed on the semiconductor substrate but to leave the upper face of the semiconductor substrate intact, a resistance between the vertically stacked semiconductor structures may be increased because the plug does not include impurities so that the plug may have a relatively higher resistance compared to that of the semiconductor substrate having doped impurities.

Figure 2:
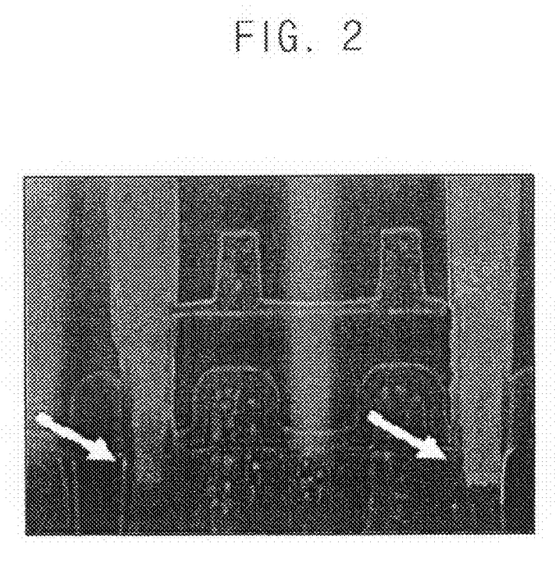

Additionally, as shown in FIG. 2, the second opening may be formed to expose some portions of the semiconductor substrate in addition to the upper face of the semiconductor substrate because an etching degree of the insulation layers may be controlled only by a processing time when the second opening is formed. When the conductive material is formed in the second opening exposing the above portions of the semiconductor substrate, a leakage current may be generated in the semiconductor substrate.

In order to solve the above-mentioned problems, a stacked semiconductor device is disclosed in Korean Patent No. 10-0655664.

The stacked semiconductor device in the above Korean patent includes a first plug having impurities doped thereto and a second plug not having impurities. Thus, the etching degree of the insulation layers may be controlled by detecting the first plug having the impurities instead of measuring the processing time when the second opening is formed. The conductive material is formed in the second opening to be electrically connected to the first plug.

However, an additional process for doping impurities into the first plug is further performed in the above Korean patent so that time and cost of the process may be increased. Additionally, the semiconductor substrate may be damaged when an implantation process for doping the impurities into the first plug is performed. Furthermore, the first and second plugs have etching rates that are very similar to each other so that the etching degree of the insulation layers is not easily controlled by detecting the first plug.

SUMMARY OF THE INVENTION

Example embodiments of the present invention provide a stacked semiconductor device, wherein an opening for a plug that electrically connects stacked semiconductor structures is easy to form and a resistance of the plug is sufficiently low.

Example embodiments of the present invention provide a method of manufacturing the above-mentioned stacked semiconductor device.

According to one aspect of the present invention, there is provided a stacked semiconductor device. The stacked semiconductor device includes a semiconductor substrate, a multi-layered insulation layer pattern, an active layer pattern, a first plug, a second plug and a wiring. The multi-layered insulation layer pattern has at least two insulation layer patterns and an opening. The insulation layer patterns are vertically stacked on the semiconductor substrate and the opening exposes an upper face of the semiconductor substrate. The active layer pattern is formed on each of the insulation layer patterns. A side portion of the active layer pattern is exposed by the opening. The first plug is formed on the upper face of the semiconductor substrate to partially fill the opening. The first plug includes single crystalline silicon-germanium. The second plug is partially formed on the first plug. The second plug has substantially the same interface as that of the first plug and includes single crystalline silicon. The wiring is electrically connected to the first plug, and sufficiently fills up the opening.

In an example embodiment of the present invention, the semiconductor substrate may include a silicon substrate, an SOI substrate, a germanium substrate, a GOI substrate, a silicon-germanium substrate, an epitaxial layer, etc.

In an example embodiment of the present invention, the active layer pattern may be formed by an SEG process.

In an example embodiment of the present invention, the first and second plugs may be formed in-situ by an SEG process.

In an example embodiment of the present invention, the stacked semiconductor device may further include at least two semiconductor structures on each of the semiconductor substrate and the active layer. Each of the semiconductor structures may include a gate pattern and a source/drain region.

According to another aspect of the present invention, there is provided a method of manufacturing a stacked semiconductor device. In the method of manufacturing the stacked semiconductor device, a first insulation layer pattern having a first opening is formed on a semiconductor substrate. The first opening exposes an upper face of the semiconductor substrate. A first plug including single crystalline silicon-germanium and a second plug including single crystalline silicon are formed on the exposed upper face of the semiconductor substrate in-situ by a first SEG process. The first and second plugs partially fill up the first opening. A third plug is formed on the second plug by a second SEG process. The third plug fills up a remaining portion of the first opening. A first active layer pattern is formed on the first insulation layer pattern and the third plug. A second insulation layer is formed on the first active layer pattern. The second insulation layer, the first active layer pattern, the second plug and the first plug are partially etched to form a second opening exposing a top surface of the first plug and a side portion of the first active layer pattern. The second insulation layer is transformed to a second insulation layer pattern. A first wiring filling up the second opening is formed. The first wiring is electrically connected to the first plug.

In an example embodiment of the present invention, the first active layer pattern may be formed by an SEG process.

In an example embodiment of the present invention, a first semiconductor structure and a second semiconductor structure may be further formed on the semiconductor substrate and the first active layer pattern, respectively. Each of the first and second semiconductor structures may include a gate pattern and a source/drain region.

In an example embodiment of the present invention, a second active layer pattern may be further formed on the second insulation layer pattern and the first wiring. A third insulation layer pattern having a third opening may be further formed on the second active layer pattern. The third opening may expose an upper face of the first wiring. A second wiring filling up the third opening may be further formed. The second wiring may be electrically connected to the first wiring.

In an example embodiment of the present invention, a third semiconductor structure may be further formed on the second active layer pattern.

In an example embodiment of the present invention, forming the second active layer pattern, the third insulation layer pattern and the second wiring may be repeatedly performed.

In an example embodiment of the present invention, the method of manufacturing the semiconductor substrate may further comprise following steps: (a) forming a second active layer pattern on the second insulation layer pattern and the first wiring; (b) forming a third insulation layer pattern having a third opening on the second active layer pattern, the third opening exposing an upper face of the first wiring; (c) forming a fourth plug including single crystalline silicon-germanium and a fifth plug including single crystalline silicon on the exposed upper face of the first wiring in-situ by a third SEG process, the fourth and the fifth plugs partially fill up the third opening; (d) forming a sixth plug on the fifth plug by a fourth SEG process, the sixth plug fills up a remaining portion of the third opening; (e) forming a third active layer pattern on the third insulation layer pattern and the sixth plug; (f) forming a fourth insulation layer on the third active layer pattern; (g) partially etching the fourth insulation layer, the third active layer pattern, the sixth plug and the fifth plug to form a fourth opening exposing a top surface of the fourth plug and a side portion of the third active layer pattern, wherein the fourth insulation layer is transformed to a fourth insulation layer pattern; and (h) forming a second wiring filling up the fourth opening, the second wiring configured to be electrically connected to the fourth plug.

In an example embodiment of the present invention, steps (a) to (h) may be repeatedly performed.

According to some example embodiments of the present invention, the first to third plugs are formed and used when the second opening is formed. That is, when the second opening is formed by an etching process, the first plug may serve as an etch stop layer because the first plug includes single crystalline silicon-germanium so that the first plug has an etching selectivity with respect to the second plug or the third plug. Additionally, the first and second plugs have substantially the same interface so that defects may be generated less than when the first and second plugs have different interfaces while forming the second opening.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DESCRIPTION OF THE EMBODIMENTS

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
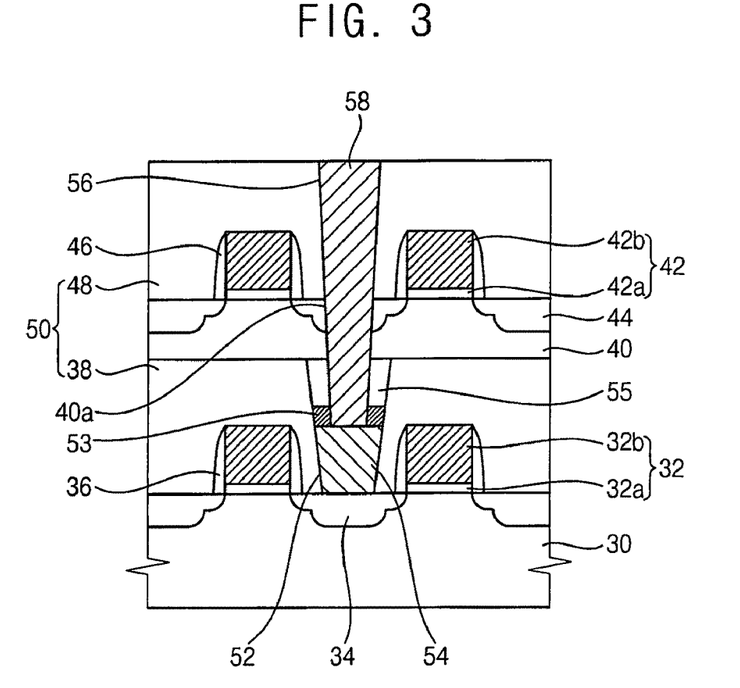
FIG. 3 is a cross-sectional view illustrating a stacked semiconductor device in accordance with example embodiments of the present invention.

FIG. 3 is a cross-sectional view illustrating a stacked semiconductor device in accordance with example embodiments of the present invention. Although FIG. 3 illustrates a double-stacked SRAM device, advantages of the present invention may be employed in a triple-stacked static random access memory (SRAM) device, a system-on-chip (SOC), etc.

Referring to FIG. 3, the stacked semiconductor device includes a semiconductor substrate 30. The semiconductor substrate 30 may include a silicon substrate, an silicon-on-insulator (SOI) substrate, a germanium substrate, a germanium-on-insulator (GOI) substrate, a silicon-germanium substrate, an epitaxial layer, etc. The epitaxial layer may be formed by a selective epitaxial growth (SEG) process. In an example embodiment of the present invention, the semiconductor substrate 30 is a silicon substrate or a germanium substrate.

A first gate pattern 32 is formed on the semiconductor substrate 30, and a first source/drain region 34 into which first impurities are doped is formed at an upper portion of the semiconductor substrate 30 adjacent to the first gate pattern 32. The first gate pattern 32 includes a first gate insulation layer pattern 32a and a first gate conductive pattern 32b. Thus, a first transistor having the first gate pattern 32 and the first source/drain region 34 is formed on and at the upper portion of the semiconductor substrate 30. The first transistor may be used as a first semiconductor structure.

The first impurities may include boron, phosphorus, arsenic, etc. Particularly, when the first transistor is an N-type metal-oxide-semiconductor (NMOS) transistor, the first impurities may include phosphorus, arsenic, etc. Additionally, when the first transistor is a P-type metal-oxide-semiconductor (PMOS) transistor, the first impurities may include boron.

A first spacer 36 is formed at a sidewall of the first gate pattern 32. Thus, the first transistor may have a lightly doped drain (LDD) structure in which a first portion of the first source/drain region 34 disposed close to a channel is less heavily doped than a second portion of the first source/drain region 34 disposed relatively distant from the channel.

The first semiconductor structure may further include a logic unit, a metal wiring, etc.

A multi-layered insulation layer pattern 50 including a first insulation layer pattern 38 and a second insulation layer pattern 48 is formed on the semiconductor substrate 30. In the present embodiment, the multi-layered insulation layer pattern 50 includes the first and second insulation layer patterns 38 and 48 because the stacked semiconductor device has a double-stacked structure. The first insulation layer pattern 38 is formed under the second insulation layer pattern 48.

However, when the stacked semiconductor device is a triple-stacked semiconductor device, the multi-layered insulation layer pattern 50 includes three insulation layer patterns. Alternatively, the multi-layered insulation layer pattern 50 may include more than three insulation layer patterns.

An active layer pattern 40 is formed on the first insulation layer pattern 38. The active layer pattern 40 may be formed by patterning an epitaxial layer that is formed by an SEG process.

A second semiconductor structure is formed on the active layer pattern 40. The second semiconductor structure may have substantially the same structure as that of the first semiconductor structure. Thus, the second semiconductor structure may include a second gate pattern 42 having a second gate insulation layer pattern 42a and a second gate conductive pattern 42b, and a second source/drain region 44. Second impurities may be doped into the second source/drain region 44. Additionally, a second spacer 46 may be further formed at a sidewall of the second gate pattern 42. When the second spacer 46 is formed, the second source/drain region may have an LDD structure.

Furthermore, each of the first and second semiconductor structures may include a logic unit, a metal wiring, etc.

The second impurities may include boron, phosphorus, arsenic, etc. Particularly, when the second transistor is an N-type metal-oxide-semiconductor (NMOS) transistor, the second impurities may include phosphorus, arsenic, etc. Additionally, when the second transistor is a P-type metal-oxide-semiconductor (PMOS) transistor, the second impurities may include boron.

The first insulation layer pattern 38 has a first opening 52 exposing an upper face of the semiconductor substrate 30. In an example embodiment of the present invention, the first opening 52 exposes the first source/drain region 34 of the semiconductor substrate 30. A first plug 54 is formed on the exposed upper face of the semiconductor substrate 30 to partially fill the first opening 52.

In an example embodiment of the present invention, a first portion of a second plug 53 and a second portion of a third plug 55 remain on the first plug 54. Alternatively, the second and third plugs 53 and 55 are sufficiently removed when a second opening 56 is formed, and thus the first and second portions may not remain on the first plug 54.

The first plug 54 may include single crystalline silicon-germanium, and each of the second and third plugs 53 and 55 may include single crystalline silicon. The first and second plugs 54 and 53 make contact with each other, thereby having substantially the same interface. The first and second plugs 54 and 53 may be formed in-situ by an SEG process.

The multi-layered insulation layer 50 has a second opening 56 exposing the first plug 54. In an example embodiment of the present invention, the second opening 56 exposes side portions of the second and third plugs 53 and 55, i.e., the first and second portions of the second and third plugs 53 and 55, respectively. The first and second portions of the second and third plugs 53 and 55 are not removed while forming the second opening 56 and remain on the first plug 54, and the second opening 56 exposes the first plug 54.

The second opening 56 also exposes a side portion of the active layer pattern 40. Particularly, the second opening 56 exposes a side portion of the active layer pattern 40 in which the second source/drain region 44 is formed.

A wiring 58 fills up the second opening 56 to be electrically connected to the first plug 54. The wiring 58 may include a conductive material such as metal. The wiring 58 may include a barrier (not shown) and a filler (not shown). The barrier is continuously formed on a bottom and a sideface of the second opening 56. The filler is formed on the barrier to sufficiently fill up the second opening 56. The barrier may include titanium, titanium nitride, etc. The filler may include aluminum, tungsten, copper, etc. In an example embodiment of the present invention, the barrier has a multi-layered structure in which a titanium layer and a titanium nitride layer are sequentially stacked.

When the double-stacked semiconductor device is employed in a double-stacked SRAM device, the first semiconductor structure includes two pull-down transistors and two access transistors, which are NMOS transistors, and the second semiconductor structure includes two pull-up transistors, which are PMOS transistors. The NMOS transistors and the PMOS transistors are electrically connected to each other via the first plug 54 and the wiring 58. Thus, the double-stacked SRAM device having a decreased resistance may be formed.

Hereinafter, a method of manufacturing a stacked semiconductor device is illustrated.

FIGS. 4A to 4I are cross-sectional views illustrating a method of manufacturing the double-stacked semiconductor device in FIG. 3. Like numerals refer to like elements throughout FIGS. 3 to 4I.

Figure 4A:
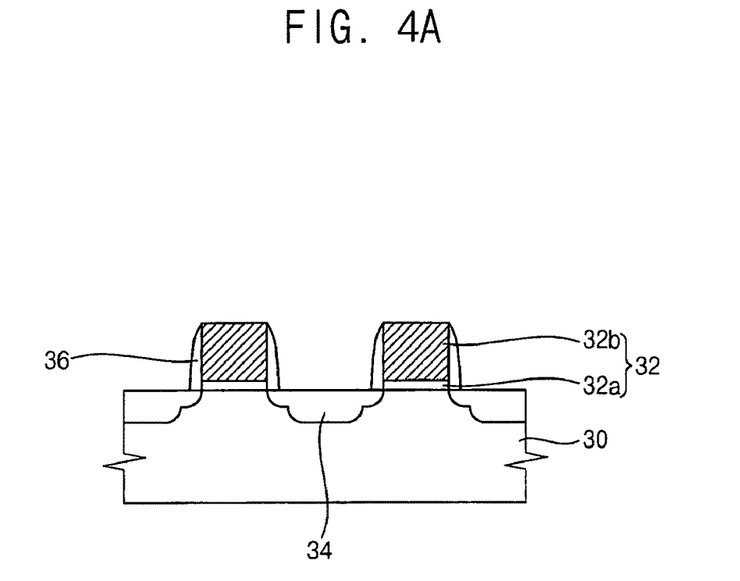
FIGS. 4A to 4I are cross-sectional views illustrating a method of manufacturing the double-stacked semiconductor device in FIG. 3.

Referring to FIG. 4A, a semiconductor substrate 30 is prepared. The semiconductor substrate 30 may include a silicon substrate, an SOI substrate, a germanium substrate, a GOI substrate, a silicon-germanium substrate, an epitaxial layer, etc. The epitaxial layer may be formed by an SEG process. In an example embodiment of the present invention, the semiconductor substrate 30 is a silicon substrate or a germanium substrate.

An isolation layer (not shown) is formed on the semiconductor substrate 30 to define an active region and a field region. The isolation layer may be formed by a shallow trench isolation (STI) process or a local oxidation of silicon (LOCOS) process. In an example embodiment of the present invention, the isolation layer is formed by a STI process so that an integration degree of the semiconductor device may be increased.

A first gate pattern 32 including a first gate insulation layer pattern 32a and a first gate conductive pattern 32b is formed on the semiconductor substrate 30, and a first source/drain region 34 into which first impurities are doped is formed at an upper portion of the semiconductor substrate 30 adjacent to the first gate pattern 32.

Particularly, an insulation layer and a conductive layer are formed on the semiconductor substrate 30. The conductive layer and the insulation layer are partially removed by a conventional photolithography process. Thus, the first gate pattern 32 including the first gate insulation layer pattern 32a and the first gate conductive pattern 32b sequentially stacked on the semiconductor substrate 30 may be formed.

First impurities are doped into the semiconductor substrate 30 by an implantation process using the first gate pattern 32 as an implantation mask so that an LDD region may be formed at an upper portion of the semiconductor substrate 30 adjacent to the first gate pattern 32. The first impurities may include boron, phosphorus, arsenic, etc. Particularly, when the double-stacked semiconductor device is employed in a double-stacked SRAM device, the first impurities may include phosphorus, arsenic, etc., because an NMOS transistor is formed on and at the upper portion of the semiconductor substrate 30.

A first spacer 36 is formed at a sidewall of the first gate pattern 32. The first spacer 36 may be formed using silicon nitride. The first spacer 36 may be formed by an etching process using an etching selectivity between silicon nitride and silicon or germanium. Alternatively, the first spacer 36 may not be formed at the sidewall of the first gate pattern 32. When the first spacer 36 is not formed, the LDD region may serve as a first source/drain region 34.

First impurities are doped again into the semiconductor substrate 30 by an implantation process using the first gate pattern 32 and the first spacer 36 as implantation masks so that a highly doped drain (HDD) region may be formed at an upper portion of the semiconductor substrate 30 adjacent to the first spacer 36. The HDD region may have a higher concentration of the first impurities than that of the LDD region.

Thus, the first source/drain region 34 including the LDD region and the HDD region may be formed at an upper portion of the semiconductor substrate 30.

Figure 4B:
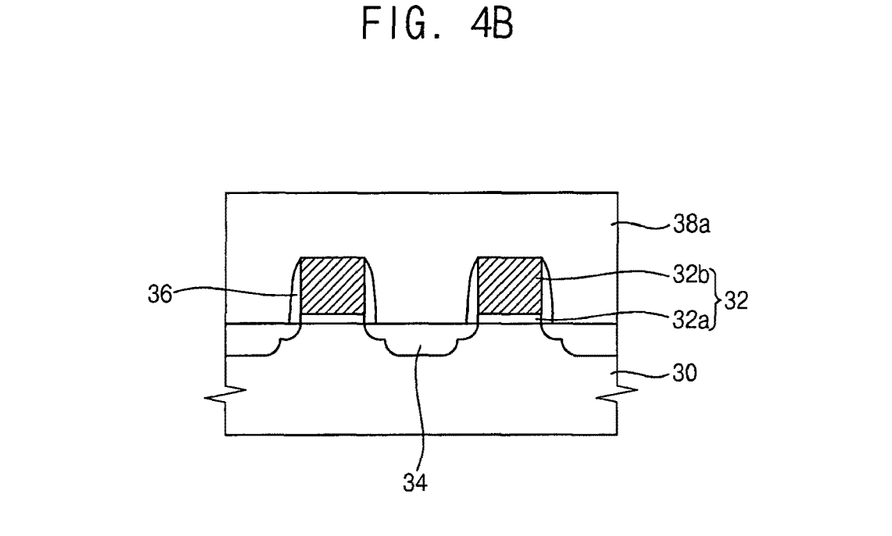

Referring to FIG. 4B, a first insulation layer 38a is formed on the semiconductor substrate 30 to cover a first semiconductor structure including the first gate pattern 32 and the first source/drain region 34. The first insulation layer 38a may include a silicon oxide such as borophosphor silicate glass (BPSG), phosphor silicate glass (PSG), undoped silicate glass (USG), spin-on-glass (SOG), etc.

Figure 4C:
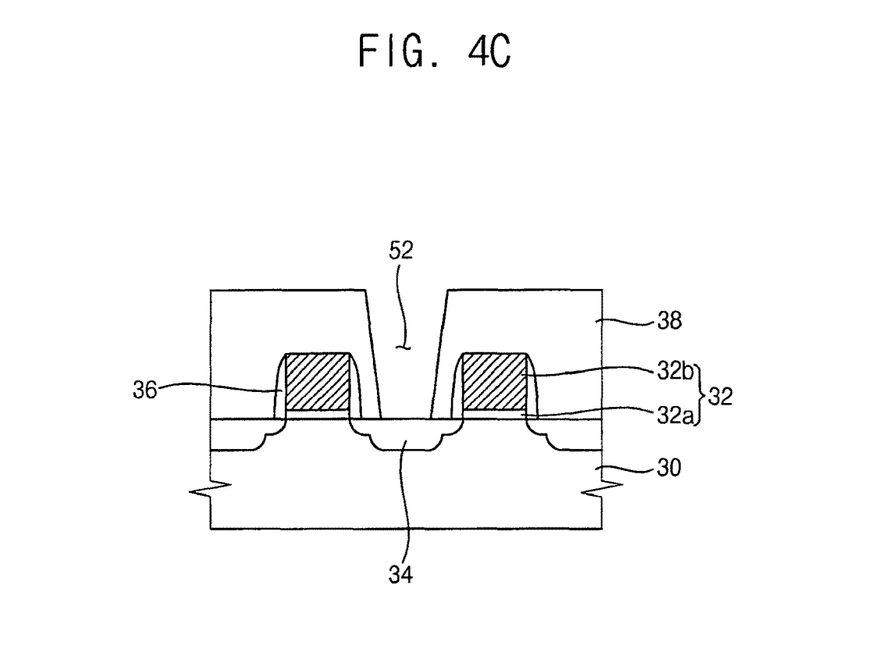

Referring to FIG. 4C, the first insulation layer 38a is partially removed to form a first opening 52 exposing the semiconductor substrate 30. Thus, the first insulation layer 38a is transformed to a first insulation layer pattern 38. In some example embodiments of the present invention, the first opening 52 exposes an upper face of the semiconductor substrate 30 beneath which the first source/drain region 34 is formed because the first source/drain region 34 is electrically connected to a second semiconductor structure formed on the first insulation layer pattern 38.

The first insulation layer 38a may be partially removed by a photolithography process. Particularly, a photoresist pattern (not shown) is formed on the first insulation layer 38a to expose a portion of the first insulation layer 38a. The exposed portion of the first insulation layer 38a is disposed over the first source/drain region 34. After the exposed portion of the first insulation layer 38a is removed by an etching process using the photoresist pattern as an etching mask, the photoresist pattern is removed from the first insulation layer 38a. Thus, the first insulation layer pattern 38 having the first opening 52 is formed.

Figure 4D:
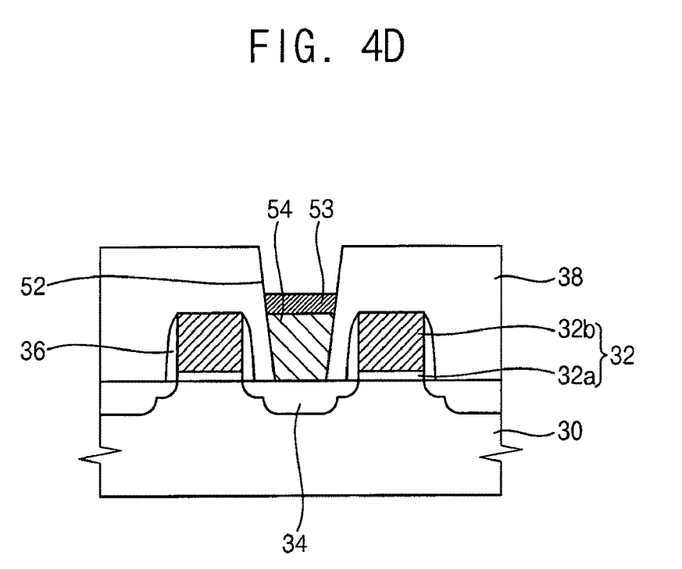

Referring to FIG. 4D, a first plug 54 and a second plug 53 are formed on the semiconductor substrate 30 to fill the first opening 52. The first and second plugs 54 and 53 may be formed in-situ by an SEG process.

Particularly, the first plug 54 is formed on the exposed upper face of the semiconductor substrate 30 by a first SEG process. When the first SEG process is performed at a temperature of less than about 600° C., the first plug 54 may not easily grow. When the first SEG process is performed at a temperature higher than about 1,100° C., the first semiconductor structure may be damaged by a thermal stress. Thus, in an example embodiment of the present invention, the first SEG process is performed at a temperature of about 600 to about 1,100° C. When the first SEG process is performed, a silicon source gas such as silane (SiH$_4$) gas, disilicon hydride (Si$_2$H$_6$) gas, etc. and a germanium source gas such as germane (GeH$_4$) gas, germane tetrafluoride (GeF$_4$) gas, etc. are provided onto the semiconductor substrate 30.

The second plug 53 is formed on the first plug 54 by a second SEG process. The second SEG process may be performed in-situ along with the first SEG process. The second SEG process may be performed under conditions substantially the same as those under which the first SEG process is performed except for stopping providing the germanium source gas. Thus, the second plug 53 may include single crystalline silicon.

When performing the first and second SEG processes, the first opening 52 is partially filled with the first plug 54 including single crystalline silicon-germanium and second plug 53 including single crystalline silicon. The first and second plugs 54 and 53 are formed in-situ, thereby having substantially the same interface, and thus defects may not be generated in the interface between the first and second plugs 54 and 53.

Figure 4E:
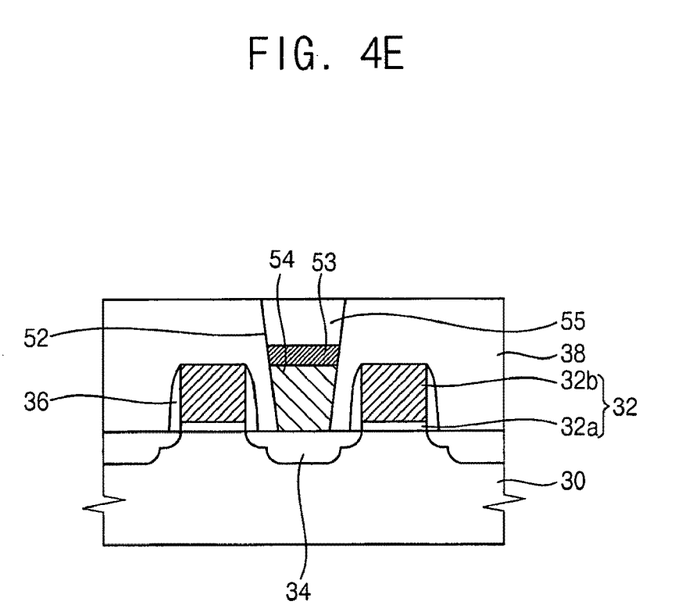

Referring to FIG. 4E, a third plug 55 is formed on the second plug 53 by a third SEG process. The third plug 55 may fill up the remaining portion of the first opening 52. Thus, the first opening 52 is filled up with the first, second and third plugs 54, 53 and 55.

The third plug 55 may be formed by the third SEG process, which is separately performed from the first and second SEG processes. When the third SEG process is performed, a silicon source gas is provided onto the second plug 53. Thus, the third plug 55 may be formed to include single crystalline silicon.

The third plug 55 is formed by the third SEG process separately performed from the second SEG process, because the semiconductor substrate 30 may be damaged by a thermal stress when the second plug 53 is continuously grown to sufficiently fill up the first opening 52.

Figure 4F:
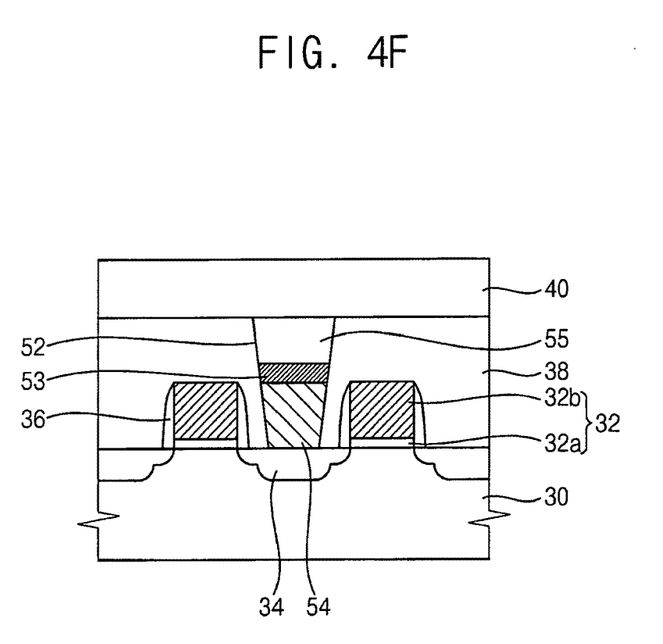

Referring to FIG. 4F, an active layer pattern 40 is formed on the first insulation layer pattern 38 and the third plug 55. The active layer pattern 40 may serve as a channel region of the second semiconductor substrate. The active layer pattern 40 may have substantially the same structure as that of the semiconductor substrate 30.

Particularly, an amorphous epitaxial layer is formed on the first insulation layer pattern 38 and the third plug 55 using the third plug 55 as a seed layer. The amorphous epitaxial layer may be converted into a single crystalline epitaxial layer by a heat treatment process. The heat treatment process may be performed by emitting a laser beam onto the amorphous epitaxial layer. In an example embodiment of the present invention, the laser beam is emitted onto the amorphous epitaxial layer for about a few nanoseconds to about hundreds of nanoseconds at a temperature at which the amorphous epitaxial layer may be melted. The single crystalline epitaxial layer is patterned, so as to form the active layer pattern 40. An isolation layer is not easily formed on the single crystalline epitaxial layer. Thus, the single crystalline epitaxial layer is patterned instead of forming the isolation layer, and the active layer pattern 40 serves as an active region.

Figure 4G:
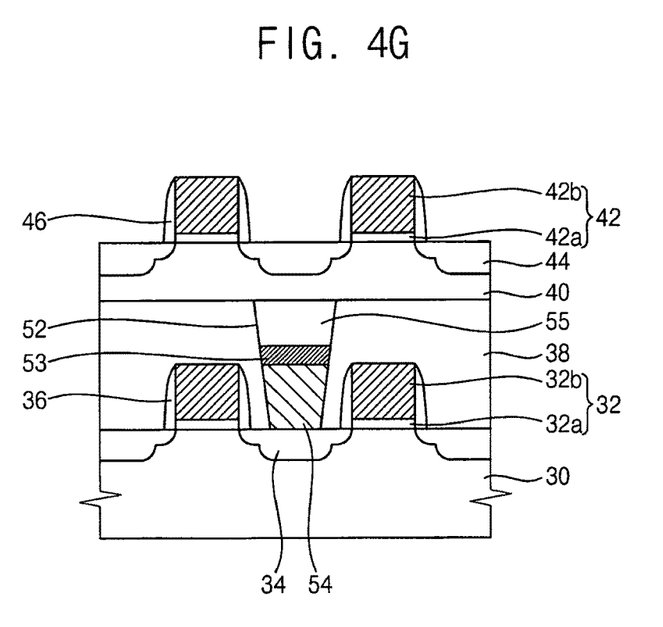

Referring to FIG. 4G, the second semiconductor structure including a second gate pattern 42 and a second source/drain region 44 is formed on and at an upper portion of the active layer pattern 40. The second semiconductor structure may be formed by substantially the same processes as those by which the first semiconductor substrate is formed.

However, second impurities doped into the second source/drain region 44 may be different from the first impurities.

Figure 4H:
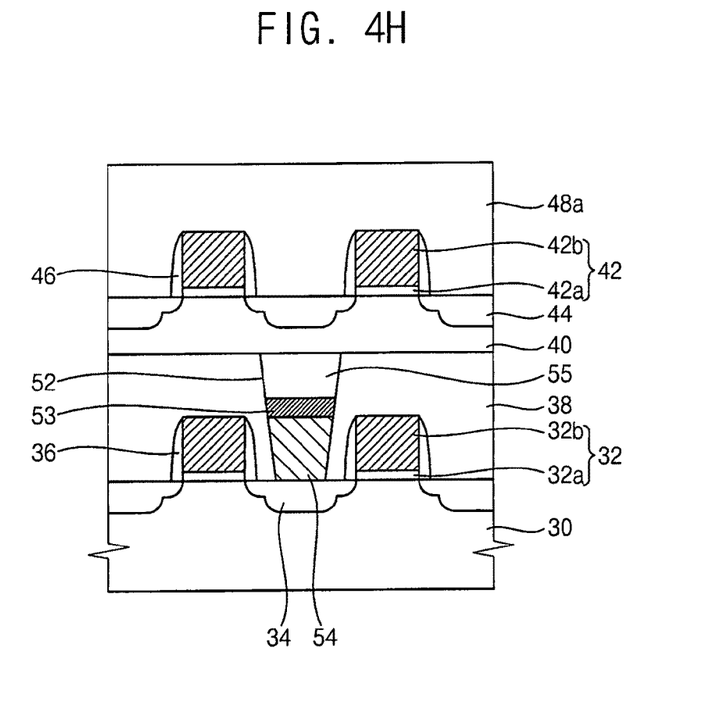

Referring to FIG. 4H, a second insulation layer 48a is formed on the first active layer pattern 40 on and at an upper portion of which the second semiconductor structure is formed. The second insulation layer 48a may include substantially the same material as that of the first insulation layer 38a. Thus, the second insulation layer 48a may include BPSG, PSG, USG, SOG, etc.

Figure 4I:
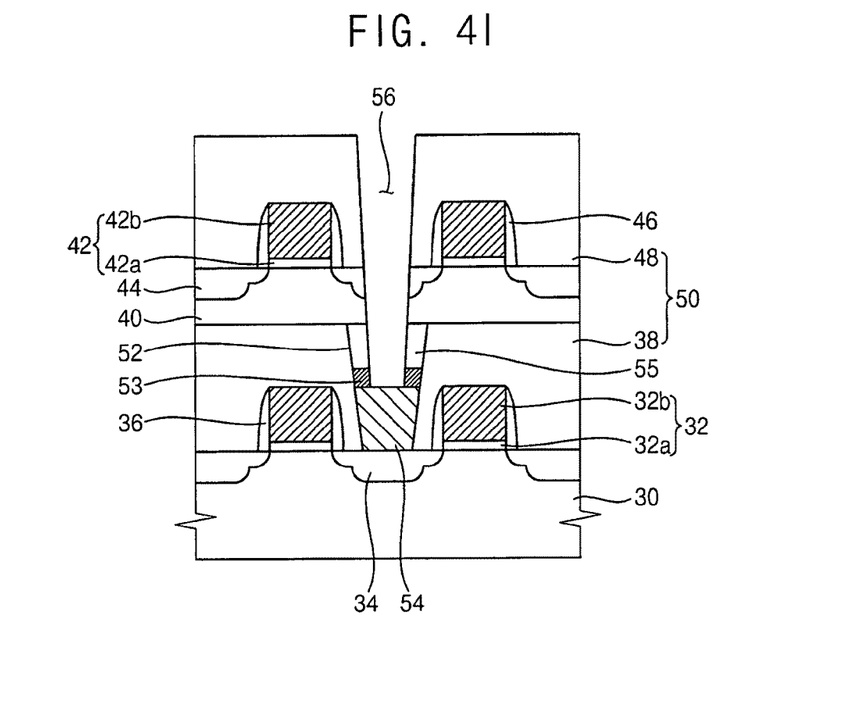

Referring to FIG. 4I, the second insulation layer 48a, the active layer pattern 40, the third plug 55 and the second plug 53 are partially etched to form a second opening 56 exposing a top surface of the first plug 54. The second insulation layer 48a is transformed to a second insulation layer pattern 48. Additionally, the first and second insulation layers 38 and 48 may be used as a multi-layered insulation layer pattern 50. When the second opening 56 is formed by an etching process, the etching process may be performed using an etching selectivity of the first plug 54 with respect to the second and third plugs 53 and 55. That is, the etching process may be performed using an etching selectivity between silicon-germanium and silicon.

As the etching process is performed using the etching selectivity, the second opening 56 exactly exposing the top surface of the first plug 54 may be formed. That is, the second opening 56 does not only expose side portions of the second plug 53 and the third plug 55 but also expose the top surface of the first plug 54 without exposing the semiconductor substrate 30.

In some example embodiments of the present invention, the second opening 56 exposes a side portion of the active layer pattern 40 in which the second source/drain region 44 is formed. Additionally, the second opening 56 exposes the top surface of the first plug 54 under which the first source/drain region 34 is formed.

As mentioned above, the second opening 56 may be formed using the etching selectivity of the first plug 54 so that the second opening 56 may be easily formed to expose the top surface of the first plug 54.

A wiring 58 is formed on the top surface of the first plug 54 to fill up the second opening 56. The wiring 58 may be formed using a conductive material such as metal. In an example embodiment of the present invention, the wiring 58 includes a barrier and a filler. Particularly, the barrier is continuously formed on a bottom and a sidewall of the second opening 56, and the filler is formed on the barrier to fill up the remaining portion of the second opening 56.

As the wiring 58 is formed in the second opening 56, the wiring 58 is electrically connected to the first plug 54. The first plug 54 includes silicon-germanium so that a resistance of the first plug 54 may be low. Thus, the first and second semiconductor structures may be electrically connected to each other with a low resistance via the first plug 54 and the wiring 58.

According to some example embodiments of the present invention, the second opening 56 may be readily formed by an etching process because the etching selectivity of the first plug 54 including silicon-germanium is used while performing the etching process. Additionally, the first and second plugs 54 and 53 have substantially the same interface so that defects may not be generated at the interface when the etching process is performed. Furthermore, the first plug 54 includes silicon-germanium so that the electric resistance of the first plug 54 and the wiring 58 may be sufficiently reduced.

Thus, the stacked semiconductor device in accordance with example embodiments of the present invention may be employed in any stacked semiconductor devices that require complicated manufacturing processes and good electric reliability.

Although the double-stacked semiconductor device is mainly illustrated above, advantages of the present invention may be also employed in a triple-stacked semiconductor device such as a triple-stacked SRAM device. Additionally, the advantages of the present invention may be furthermore employed in a quadruple-stacked semiconductor device, a fivefold-stacked semiconductor device, etc.

According to the present invention, a stacked semiconductor device having an opening may be easily manufactured without generating defects. Additionally, the stacked semiconductor device having a decreased resistance may be easily manufactured. Thus, the stacked semiconductor device may have an improved reliability.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A stacked semiconductor device comprising:
   a semiconductor substrate;
   a multi-layered insulation layer pattern having at least two insulation layer patterns and an opening, wherein the insulation layer patterns are vertically stacked on the semiconductor substrate and the opening is a single void structure within the multi-layered insulation layer that exposes an upper face of the semiconductor substrate;
   an active layer pattern on each of the insulation layer patterns, wherein a side portion of the active layer pattern is exposed by the opening;
   a first plug on the upper face of the semiconductor substrate to partially fill the opening, the first plug including single crystalline silicon-germanium;
   a second plug partially filling the opening on an upper face of the first plug, wherein the second plug has substantially the same interface as that of the first plug and includes single crystalline silicon,
   wherein the first and second plugs include different materials from each other; and
   a pad making direct contact with the first plug through the second plug, the pad sufficiently filling up the opening and including at least one of metal and metal nitride.

2. The device of claim 1, wherein the semiconductor substrate comprises any one selected from the group consisting of a silicon substrate, a silicon-on-insulator (SOI) substrate, a germanium substrate, a germanium-on-insulator (GOI) substrate, a silicon-germanium substrate and an epitaxial layer.

3. The device of claim 1, wherein the active layer pattern is formed by a selective epitaxial growth (SEG) process.

4. The device of claim 1, wherein the first and second plugs are formed in-situ by an SEG process.

5. The device of claim 1, further comprising at least two semiconductor structures on each of the semiconductor substrates and the active layer, each of the semiconductor structures including a gate pattern and a source/drain region.

* * * * *